(12) United States Patent
de Raad et al.

(10) Patent No.: US 11,532,936 B2
(45) Date of Patent: Dec. 20, 2022

(54) ELECTROSTATIC DISCHARGE (ESD) PROTECTION DEVICE

(71) Applicant: NXP B.V., Eindhoven (NL)

(72) Inventors: Gijs Jan de Raad, Bemmel (NL); Junfei Yu, Shanghai (CN); Rongrong Tang, Shanghai (CN); Haojing Wu, Shanghai (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/332,619

(22) Filed: May 27, 2021

(65) Prior Publication Data

US 2022/0209527 A1    Jun. 30, 2022

(30) Foreign Application Priority Data

Dec. 29, 2020   (CN) ......................... 202011610929.8

(51) Int. Cl.
  *H02H 9/04* (2006.01)
  *H02H 9/00* (2006.01)
  *H01L 23/62* (2006.01)

(52) U.S. Cl.
  CPC .............. *H02H 9/005* (2013.01); *H02H 9/04* (2013.01); *H02H 9/041* (2013.01); *H02H 9/044* (2013.01); *H01L 23/62* (2013.01); *H02H 9/046* (2013.01)

(58) Field of Classification Search
  CPC ........... H02H 9/00; H02H 9/04; H02H 9/005; H02H 9/044; H02H 9/041; H02H 9/046; H01L 23/62

USPC .................................................. 361/56, 91.1
See application file for complete search history.

(56) References Cited

U.S. PATENT DOCUMENTS

| | | | |
|---|---|---|---|
| 5,610,790 A | 3/1997 | Staab et al. | |
| 6,583,972 B2 | 6/2003 | Verhaege et al. | |
| 6,635,930 B1 * | 10/2003 | Hauptmann | H02H 9/046 257/361 |
| 7,224,560 B2 | 5/2007 | May et al. | |
| 8,247,845 B2 | 8/2012 | Schroeder et al. | |
| 8,947,841 B2 | 2/2015 | Salcedo et al. | |
| 8,947,984 B2 | 2/2015 | Hattori et al. | |
| 9,545,041 B2 * | 1/2017 | Lai | H01L 27/0266 |

* cited by examiner

*Primary Examiner* — Danny Nguyen

(57) ABSTRACT

Embodiments of an ESD protection device are described. In an embodiment, an ESD protection device includes a first voltage rail electrically connected to a first node, a second voltage rail electrically connected to a second node, and ESD cells connected between the first and second voltage rails and configured to shunt current in response to an ESD pulse received between the first and second nodes. Each of the ESD cells includes clamp circuits electrically connected to the second voltage rail, ballast resistors connected between the first voltage rail and the clamp circuits, where at least some of the ballast resistors are electrically connected to a third voltage rail, a driver circuit connected between the second and third voltage rails and configured to generate a driver signal, and an output stage configured to generate an output signal in response to the driver signal.

20 Claims, 10 Drawing Sheets

ELECTROSTATIC DISCHARGE (ESD) PROTECTION DEVICE

CROSS-REFERENCE TO RELATED APPLICATIONS

This application claims the priority under 35 U.S.C. § 119 of China patent application no. 202011610929.8, filed Dec. 20, 2020 the contents of which are incorporated by reference herein.

BACKGROUND

Embodiments of the invention relate generally to electronic hardware, and, more particularly, to electrostatic discharge (ESD) protection devices.

Electrostatic discharge is a sudden flow of electricity that can be caused by a buildup of static electricity. An ESD protection device can be used to shunt ESD current to prevent damage in a device. For example, an ESD protection device can be integrated onto an electrical device, such as an integrated circuit (IC) chip, to provide a low impedance channel to prevent thermal damage to components of the electrical device. The operating characteristics (e.g., current distribution and/or internal voltage when shunting ESD current) of an ESD protection device can affect the performance of the ESD protection device.

SUMMARY

Embodiments of an ESD protection device are described. In an embodiment, an ESD protection device includes a first voltage rail electrically connected to a first node, a second voltage rail electrically connected to a second node, and ESD cells connected between the first and second voltage rails and configured to shunt current in response to an ESD pulse received between the first and second nodes. Each of the ESD cells includes clamp circuits electrically connected to the second voltage rail, multiple ballast resistors connected between the first voltage rail and the clamp circuits, where at least some of the ballast resistors are electrically connected to a third voltage rail, a driver circuit connected between the second and third voltage rails and configured to generate a driver signal, and an output stage configured to generate an output signal in response to the driver signal. Other embodiments are also described.

In an embodiment, in each of the ESD cells, the driver circuit includes a gate driver connected between the second voltage rail and the third voltage rail and a gate driver protection circuit configured to protect the gate driver.

In an embodiment, the gate driver protection circuit includes diodes electrically connected to an output of the gate driver, resistors electrically connected to the diodes and to the output of the gate driver, and transistor devices electrically connected to the first voltage rail or the second voltage rail.

In an embodiment, the first voltage rail has a first voltage, the second voltage rail has a second voltage, and the second voltage is lower than the first voltage.

In an embodiment, the third voltage rail has a third voltage, and the third voltage is higher than the second voltage but is lower than the first voltage.

In an embodiment, the second voltage is zero volt.

In an embodiment, the clamp circuits in each of the ESD cells are of the same type.

In an embodiment, the clamp circuits in each of the ESD cells are of different types.

In an embodiment, the ballast resistors in each of the ESD cells are identical to each other.

In an embodiment, each of the ballast resistors in one of the ESD cells have a unique resistance value.

In an embodiment, in each of the ESD cells, the output stage includes diodes electrically between the first voltage rail and the second voltage rail, transistor devices electrically connected to the first voltage rail or the second voltage rail, and resistors electrically connected to the diodes and to the transistor devices.

In an embodiment, at least one of the clamp circuits in one of the ESD cells includes a transistor device electrically connected to the second voltage rail and a trigger circuit configured to trigger the transistor device.

In an embodiment, the transistor device includes an N-channel metal-oxide-semiconductor field-effect transistor (MOSFET) (NMOS) transistor.

In an embodiment, at least one of the clamp circuits in one of the ESD cells includes a transistor device having two terminals electrically connected to the second voltage rail.

In an embodiment, the transistor device includes a grounded gate NMOS transistor (GGNmost).

In an embodiment, each of the ESD cells further includes a clamp circuit connected between the third voltage rail and the second voltage rail.

In an embodiment, each of the ESD cells further includes at least one resistor connected between the ballast resistors and the third voltage rail.

In an embodiment, the ESD protection device is an integrated circuit (IC) device.

In an embodiment, an ESD protection device includes a first voltage rail electrically connected to a first node, a second voltage rail electrically connected to a second node, and ESD cells connected between the first and second voltage rails and configured to shunt current in response to an ESD pulse received between the first and second nodes. Each of the ESD cells includes clamp circuits electrically connected to the second voltage rail, ballast resistors connected between the first voltage rail and the clamp circuits, wherein at least some of the ballast resistors are electrically connected to a third voltage rail via another set of resistors, a driver circuit connected between the second and third voltage rails and configured to generate a driver signal, and an output stage configured to generate an output signal in response to the driver signal. The driver circuit includes a gate driver connected between the second voltage rail and the third voltage rail and a gate driver protection circuit configured to protect the gate driver.

In an embodiment, an ESD protection device includes a first voltage rail electrically connected to a first node, a second voltage rail electrically connected to a second node, and ESD cells connected between the first and second voltage rails and configured to shunt current in response to an ESD pulse received between the first and second nodes. Each of the ESD cells includes grounded gate NMOS transistors (GGNmosts) electrically connected to the second voltage rail and a third voltage rail, a driver circuit connected between the second and third voltage rails and configured to generate a driver signal, and an output stage configured to generate an output signal in response to the driver signal.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
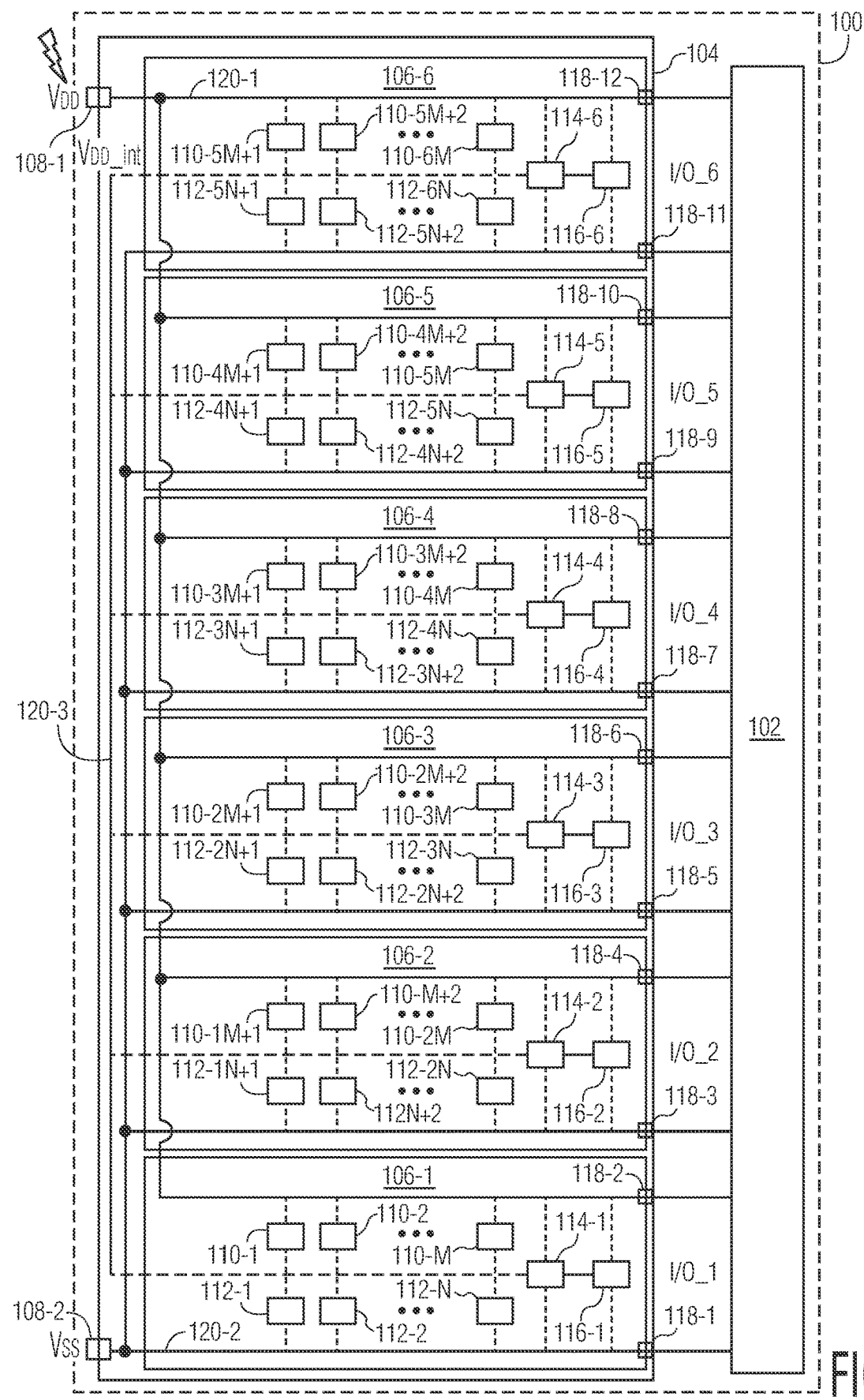
FIG. 1 is a schematic block diagram of an electrical device in accordance with an embodiment of the invention.

FIG. 1 is a schematic block diagram of an electrical device 100 in accordance with an embodiment of the invention. In the embodiment depicted in FIG. 1, the electrical device includes a core circuit 102 and an ESD protection device 104. The ESD protection device 104 is used to protect the core circuit during an ESD event, which may be an ESD test or an actual ESD strike. In the embodiment depicted in FIG. 1, the ESD protection device is electrically connected to first and second nodes or electrical terminals 108-1, 108-2. The first and second nodes 108-1, 108-2 may be coupled to different voltages. In some embodiments, the first and second nodes 108-1, 108-2 are components of the ESD protection device 104. In the embodiment depicted in FIG. 1, the first node 108-1 is electrically connected to a first voltage rail 120-1 having a positive voltage, $V_{DD}$, and the second node 108-2 is electrically connected to a second voltage rail 120-2 having a voltage, $V_{SS}$, which is lower than the voltage, $V_{DD}$, at the first node 108-1. In other embodiments, the second node 108-2 is electrically connected to a positive voltage (e.g., the voltage, $V_{DD}$, at the first voltage rail 120-1) and the first node 108-1 is electrically connected to a voltage (e.g., the voltage, $V_{SS}$, at the second voltage rail 120-2) that is lower than the voltage at the second node 108-2. The voltage rails 120-1, 120-2 may be implemented as electrical cables or wires. In some embodiments, the first node 108-1 and/or the second node 108-2 are electrically connected to a fixed voltage. For example, the second node 108-2 may be electrically connected to ground (zero volt). The electrical device can be used in various applications, such as automotive applications, communications applications, industrial applications, medical applications, computer applications, and/or consumer or appliance applications. In some embodiments, the electrical device is an IC device. For example, the electrical device can be implemented in a substrate, such as a semiconductor wafer or a printed circuit board (PCB). Although the electrical device is shown in FIG. 1 as including the core circuit 102 and the ESD protection device 104, in other embodiments, the electrical device may include more or less circuit elements to implement more or less functions.

In the embodiment depicted in FIG. 1, the core circuit 102 is a device to be protected by the ESD protection device 104 in case of an ESD event, such as an ESD pulse received between the first and second nodes 108-1, 108-2. In the embodiment depicted in FIG. 1, the core circuit is electrically connected to first and second nodes 108-1, 108-2 through the first and second voltage rails, 120-1, 120-2, respectively. For example, the core circuit is electrically connected to the second node 120, which may be connected to a fixed voltage (e.g., electrical ground). The core circuit typically includes one or more internal circuit components, such as transistors, capacitors, or diodes, which are susceptible to ESD strikes. Examples of the core circuit include, but are not limited to, microcontrollers, transceivers, and switching circuits, which can be used for, for example, in vehicle control or communications, identification, wireless communications, lighting control, and/or other applications. In an embodiment, the core circuit is packaged as a semiconductor IC chip.

In the embodiment depicted in FIG. 1, the ESD protection device 104 is configured to protect the core circuit 102 during an ESD event, such as an ESD pulse received between the first and second nodes 108-1, 108-2. The ESD protection device can be used to protect a power supply domain of the electrical device 100. For example, the ESD protection device may be connected to at least one power supply rail (e.g., the voltage rail 120-1 or 120-2) of the electrical device and may shunt ESD current to protect the core circuit in response to an ESD pulse. The ESD protection device can be implemented by suitable semiconductor devices. In some embodiments, the ESD protection device is an IC device and the first and second nodes are electrical terminals of the IC device, such as electrical contact pads or electrical contact pins. For example, the ESD protection device can be implemented in a substrate, such as a semiconductor wafer or a PCB. In some embodiments, the ESD protection device is implemented as a separate IC device as the core circuit 102. For example, the ESD protection device and the core circuit are implemented in separate substrates such as separate wafers or separate PCBs.

In the embodiment depicted in FIG. 1, the ESD protection device 104 includes six ESD cells 106-1, 106-2, 106-3, 106-4, 106-5, 106-6. In some embodiments, each of the ESD cells is electrically connected to the first node 108-1 (e.g., through the first voltage rail 120-1) and to the second node 108-1 (e.g., through the second voltage rail 120-2) and configured to shunt current in response to an ESD pulse received between the first and second nodes 108-1, 108-2. Each of the ESD cells includes one or more ballast resistors, one or more clamp circuits, at least one driver circuit, and at least one output stage. Specifically, in the embodiment depicted in FIG. 1, the ESD cell 106-1 is electrically connected to a first input/output (I/O) pad, I/O_1, having two nodes or terminals 118-1, 118-2 and includes one or more ballast resistors 110-1, 110-2, . . . , 110-M, where M is a positive integer, one or more clamp circuits 112-1, 112-2, . . . , 112-N, where N is a positive integer, a driver circuit 114-1, and an output stage 116-1. The ESD cell 106-2 is electrically connected to a second I/O pad, I/O_2, having two nodes or terminals 118-3, 118-4 and includes one or more ballast resistors 110-M+1, 110-M+2, . . . , 110-2M, one or more clamp circuits 112-N+1, 112-N+2, . . . , 112-2N, a driver circuit 114-2, and an output stage 116-2. The ESD cell 106-3 is electrically connected to a third I/O pad, I/O_3, having two nodes or terminals 118-5, 118-6 and includes one or more ballast resistors 110-2M+1, 110-2M+2, . . . , 110-3M, one or more clamp circuits 112-2N+1, 112-2N+2, . . . , 112-3N, a driver circuit 114-3, and an output stage 116-3. The ESD cell 106-4 is electrically connected to a fourth I/O pad, I/O_4, having two nodes or terminals 118-7, 118-8 and includes one or more ballast resistors 110-3M+1, 110-3M+2, . . . , 110-4M, one or more clamp circuits 112-3N+1, 112-3N+2, . . . , 112-4N, a driver circuit 114-4, and an output stage 116-4. The ESD cell 106-5 is electrically connected to a fifth I/O pad, I/O_5, having two nodes or terminals 118-9, 118-10 and includes one or more ballast resistors 110-4M+1, 110-4M+2, . . . , 110-5M, one or more clamp circuits 112-4N+1, 112-4N+2, . . . , 112-5N, a driver circuit 114-5, and an output stage 116-5. The ESD cell 106-6 is electrically connected to a sixth I/O pad, I/O_6, having two nodes or terminals 118-11, 118-12 and includes one or more ballast resistors 110-5M+1, 110-5M+2, . . . , 110-6M, one or more clamp circuits 112-5N+1, 112-5N+2, . . . , 112-6N, a driver circuit 114-6, and an output stage 116-6. To add a ballast resistor onto a substate area of a corresponding clamp circuit, the ballast resistor may only require a modest addition in the substrate area of the corresponding clamp circuit. In an example operation of the ESD protection device 104, the ESD cells 106-1, 106-2, 106-3, 106-4, 106-5, 106-6 of the ESD protection device shunt current in response to an ESD pulse received at the ESD protection device to keep the input voltage or current to the core circuit 102 to be within the safe operating range of the core circuit. Although the ESD protection device 104 shown in FIG. 1 as including six ESD cells 106-1, 106-2, 106-3, 106-4, 106-5, 106-6, in other embodiments, the ESD protection device 104 includes more than six ESD cells or less than six ESD cells. In addition, although the ESD cells of the ESD protection device are shown in FIG. 1 as being connected in a certain manner, in other embodiments, the ESD cells of the ESD protection device are connected differently from the embodiment depicted in FIG. 1. Further, although each ESD cell of the ESD protection device is shown in FIG. 1 as including certain components, in other embodiments, each ESD cell may include more or less components to implement more or less functions. For example, at least one of the ESD cells 106-1, 106-2, 106-3, 106-4, 106-5, 106-6 may include more than one driver circuit and/or more than one output stage. In another example, at least one of the ESD cells 106-1, 106-2, 106-3, 106-4, 106-5, 106-6 may include a different number of ballast resistors and/or a different number of clamp circuits from the rest of the ESD cells 106-1, 106-2, 106-3, 106-4, 106-5, 106-6. Additionally, although the components within each of the ESD cells 106-1, 106-2, 106-3, 106-4, 106-5, 106-6 of the ESD protection device are shown in FIG. 1 as being connected in a certain manner, in other embodiments, the components within each of the ESD cells of the ESD protection device are connected differently from the embodiment depicted in FIG. 1.

In some embodiments, with an ESD cell 106-1, 106-2, 106-3, 106-4, 106-5, or 106-6, each of the ballast resistors 110-1, 110-2, . . . , 110-M, the ballast resistors 110-M+1, 110-M+2, . . . , 110-2M, the ballast resistors 110-2M+1, 110-2M+2, . . . , 110-3M, the ballast resistors 110-3M+1, 110-3M+2, . . . , 110-4M, the ballast resistors 110-4M+1, 110-4M+2, . . . , 110-5M, and the ballast resistors 110-M+1, 110-M+2, . . . , 110-2M has a unique resistance value. Because different clamp circuit are connected to ballast resistors with different resistances value, a system level ESD current can be balanced even further, compared to using ballast resistors with the same resistances value for different clamp circuit. In some embodiments, at least one ballast resistor is implemented as a poly resistor that includes a number of strips of poly silicon with the appropriate implants, and usually local suppression of salicidation to achieve a specified resistivity in the poly silicon material. In some embodiments, at least one ballast resistor is implemented as other type of resistor, such as a well-resistor or a resistors made up of unsalicided n+ or p+ active materials.

In some embodiments, the ballast resistors 110-1, 110-2, . . . , 110-M, the ballast resistors 110-M+1, 110-M+2, . . . , 110-2M, the ballast resistors 110-2M+1, 110-2M+2, . . . , 110-3M, the ballast resistors 110-3M+1, 110-3M+2, ..., 110-4M, the ballast resistors 110-4M+1, 110-4M+2, ..., 110-5M, and/or the ballast resistors 110-M+1, 110-M+2, ..., 110-2M are connected between the first voltage rail 120-1 and the corresponding clamp circuits 112-1, 112-2, ..., 112-N, the corresponding clamp circuits 112-N+1, 112-N+2, ..., 112-2N, the corresponding clamp circuits 112-2N+1, 112-2N+2, ..., 112-3N, the corresponding clamp circuits 112-3N+1, 112-3N+2, ..., 112-4N, the corresponding clamp circuits 112-4N+1, 112-4N+2, ..., 112-5N, or the corresponding clamp circuits 112-5N+1, 112-5N+2, ..., 112-6N, respectively. In these embodiments, each clamp circuit has a dedicated ballast resistor that distributes ESD current more evenly across the clamp circuits, at the expense of increased voltage on the I/O pads, I/O_1, I/O_2, I/O_3, I/O_4, I/O_5, I/O_6, during a system level ESD pulse. In these embodiments, at least some of the ballast resistors 110-1, 110-2, ..., 110-M, the ballast resistors 110-M+1, 110-M+2, ..., 110-2M, the ballast resistors 110-2M+1, 110-2M+2, ..., 110-3M, the ballast resistors 110-3M+1, 110-3M+2, ..., 110-4M, the ballast resistors 110-4M+1, 110-4M+2, ..., 110-5M, and/or the ballast resistors 110-M+1, 110-M+2, ..., 110-2M are electrically connected to a third voltage rail 120-3 having a voltage, $V_{DD\_int}$, which is lower than the voltage, $V_{DD}$, of the first voltage rail 120-1 and is higher than the voltage, $V_{SS}$, of the second voltage rail 120-2. By connecting some of the ballast resistors to the third voltage rail (i.e., connecting the midpoints between some of the clamp circuits and the corresponding ballast resistors together to a common midpoint and tapping the internal supply from this common midpoint), a low-ohmic internal supply is provided. The low-ohmic internal supply can provide a supply voltage to at least some of the internal blocks of the ESD protection device, while at the same time, exhibit only a small amount of supply voltage decrease when more supply current is drawn. In addition, by connecting some of the ballast resistors to the third voltage rail, an asymmetric clamp array in which some of the branches have a larger value ballast resistor and a smaller clamp, and some other branches has a smaller value ballast resistor and a larger clamp, is created. Although the asymmetric clamp array may appear counter-intuitive or even counter-productive, a supporting insight is that the asymmetric clamp array can properly spread its current during an ESD event. In some embodiments, the driver circuit 114-1, 114-2, 114-3, 114-4, 114-5, or 114-6 is connected between the second and third voltage rails 120-2, 120-3 and configured to generate a driver signal (e.g., a driver voltage and/or a driver current). The driver circuits 114-1, 114-2, 114-3, 114-4, 114-5, 114-6 can sustain high voltage on the I/O pads, I/O_1, I/O_2, I/O_3, I/O_4, I/O_5, I/O_6, during a system level ESD pulse without suffering damage. In some embodiments, the output stage 116-1, 116-2, 116-3, 116-4, 116-5, or 116-6 is configured to generate an output signal (e.g., output current and/or voltage to be applied to the core circuit 102) in response to the driver signal from a corresponding driver circuit. The output stages 116-1, 116-2, 116-3, 116-4, 116-5, 116-6 can make the output robust against higher transient voltage. Consequently, the degradations in the core circuit 102 caused by overvoltage from the ESD protection device 104 can be reduced or even avoided.

Figure 2:
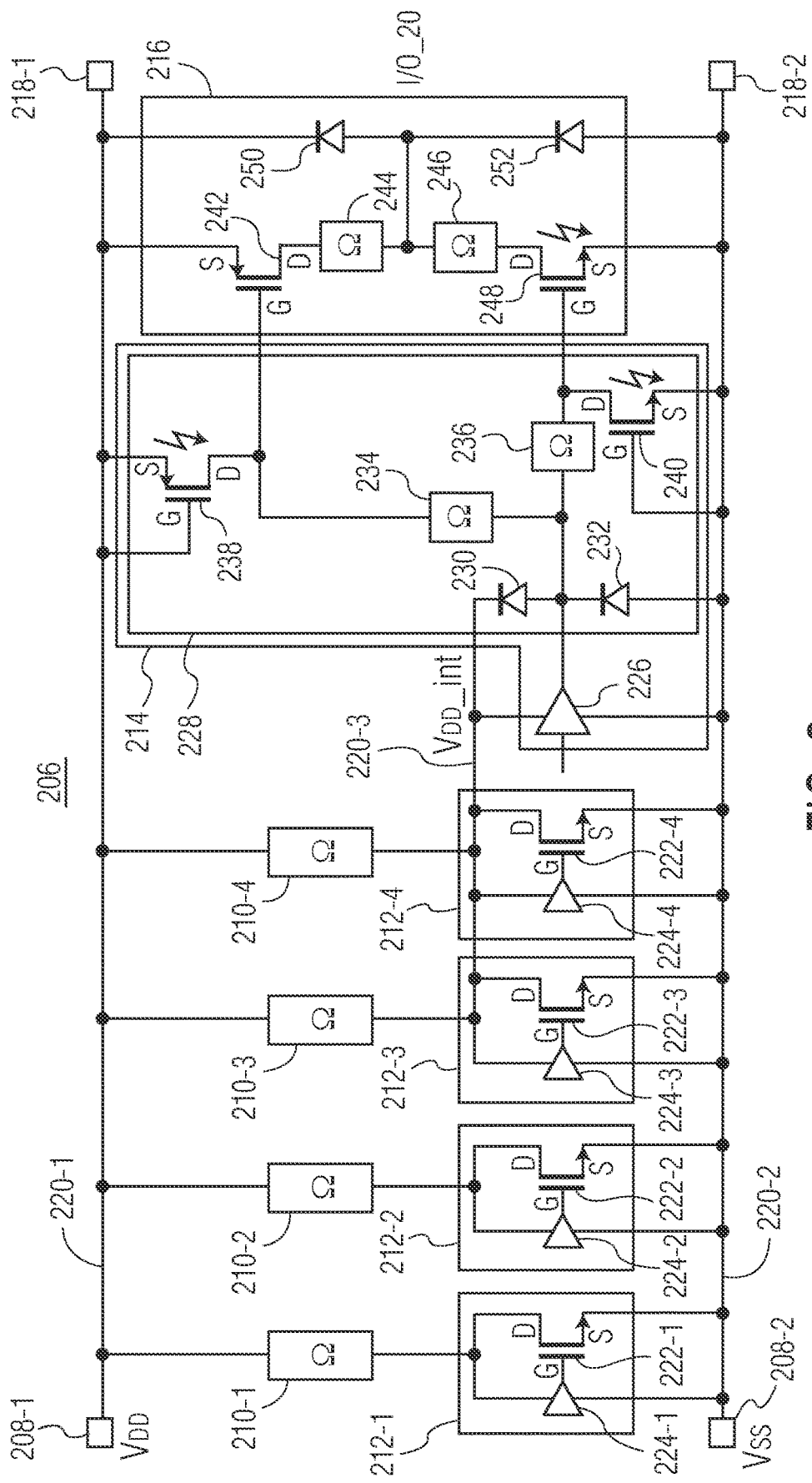
FIG. 2 depicts an ESD cell that can be used in an ESD protection device of the electrical device depicted in FIG. 1.

FIG. 2 depicts an ESD cell 206 that can be used in the ESD protection device 104 depicted in FIG. 1. In the embodiment depicted in FIG. 2, the ESD cell 206 is connected between a first voltage rail 220-1 connected to a first node 208-1 and having a voltage, $V_{DD}$, and a second voltage rail 220-2 connected to a second node 208-2 and having a voltage, $V_{SS}$, and is configured to shunt current in response to an ESD pulse received between the first and second nodes 208-1, 208-2. In some embodiments, the second node 218-2 is electrically connected to a fixed voltage. For example, the second node 218-2 is electrically connected to ground (zero volt). In the embodiment depicted in FIG. 2, the ESD cell 206 is electrically connected to an I/O pad, I/O_20, having two nodes or terminals 218-1, 218-2 and includes four clamp circuits 212-1, 212-2, 212-3, 212-4 electrically connected to the second voltage rail 220-2, four ballast resistors 210-1, 210-2, 210-3, 210-4 connected between the first voltage rail 220-1 and the clamp circuits, a driver circuit 214 connected between the second rail 220-2 and a third voltage rail 220-3, and an output stage 216. To add a ballast resistor onto a substate area of a corresponding clamp circuit, the ballast resistor only requires a modest addition in the substate area of the corresponding clamp circuit. The ESD cell 206 depicted in FIG. 2 is a possible implementation of the ESD cells 106-1, 106-2, 106-3, 106-4, 106-5, 106-6 depicted in FIG. 1. In particular, the clamp circuits 212-1, 212-2, 212-3, 212-4, the ballast resistors 210-1, 210-2, 210-3, 210-4, the driver circuit 214, the output stage 216, the first and second nodes 208-1, 208-2, the first, second, and third voltage rails 220-1, 220-2, 220-3, and the I/O pad, I/O_20, having the two nodes 218-1, 218-2 depicted in FIG. 2 are embodiments of the clamp circuits 112-1, 112-2, ..., 112-N, the clamp circuits 112-N+1, 112-N+2, ..., 112-2N, the clamp circuits 112-2N+1, 112-2N+2, ..., 112-3N, the clamp circuits 112-3N+1, 112-3N+2, ..., 112-4N, the clamp circuits 112-4N+1, 112-4N+2, ..., 112-5N, and the clamp circuits 112-5N+1, 112-5N+2, ..., 112-6N, the ballast resistors 110-1, 110-2, ..., 110-M, the ballast resistors 110-M+1, 110-M+2, ..., 110-2M, the ballast resistors 110-2M+1, 110-2M+2, ..., 110-3M, the ballast resistors 110-3M+1, 110-3M+2, ..., 110-4M, the ballast resistors 110-4M+1, 110-4M+2, ..., 110-5M, and the ballast resistors 110-M+1, 110-M+2, ..., 110-2M, the driver circuits 114-1, 114-2, 114-3, 114-4, 114-5, 114-6, the output stages 116-1, 116-2, 116-3, 116-4, 116-5, 116-6, the first and second nodes 108-1, 108-2, the first, second, and third voltage rails 120-1, 120-2, 120-3, and the I/O pads, I/O_1, I/O_2, I/O_3, I/O_4, I/O_5, I/O_6, having the two nodes 118-1, 118-2, 118-3, 118-4, 118-5, 118-6, 118-7, 118-8, 118-9, 118-10, 118-11, 118-12 depicted in FIG. 1, respectively. However, the ESD cells 106-1, 106-2, 106-3, 106-4, 106-5, 106-6 depicted in FIG. 1 are not limited to the embodiment depicted in FIG. 2 and can be implemented differently from the ESD cell 206 depicted in FIG. 2.

In the embodiment depicted in FIG. 2, each of the clamp circuits 212-1, 212-2, 212-3, 212-4 includes a transistor device 222-1, 222-2, 222-3, or 222-4, which is implemented as an N-channel metal-oxide-semiconductor field-effect transistor (MOSFET) (NMOS) transistor, and a trigger circuit 224-1, 224-2, 224-3, or 224-4 configured to trigger or control the corresponding transistor device. Specifically, the clamp circuit 212-1 includes an NMOS transistor 222-1 and a trigger circuit 224-1 configured to trigger or control the corresponding NMOS transistor 222-1, the clamp circuit 212-2 includes an NMOS transistor 222-2 and a trigger circuit 224-2 configured to trigger or control the corresponding NMOS transistor 222-2, the clamp circuit 212-3 includes an NMOS transistor 222-3 and a trigger circuit 224-3 configured to trigger or control the corresponding NMOS transistor 222-3, and the clamp circuit 212-4 includes an NMOS transistor 222-4 and a trigger circuit 224-4 configured to trigger or control the corresponding NMOS transistor 222-4. In the embodiment depicted in FIG. 2, each clamp circuit 212-1, 212-2, 212-3, or 212-4 and the corresponding ballast resistor 210-1, 210-2, 210-3, or 210-4 form a clamp branch that is connected between the first and second voltage rails 220-1, 220-2 in parallel with other clamp branches. Within each clamp branch, each clamp circuit 212-1, 212-2, 212-3, or 212-4 has a dedicated ballast resistor 210-1, 210-2, 210-3, or 210-4 that distributes ESD current more evenly across the clamp circuits. Consequently, each clamp circuit distributes an amount of ESD current that it can sink without sustaining damage. In addition, within each clamp branch, a ballast resistor 210-1, 210-2, 210-3, or 210-4 is connected to the drain terminal, D, of the NMOS transistor 222-1, 222-2, 222-3, or 222-4, a trigger circuit 224-1, 224-2, 224-3, or 224-4 is connected to the gate terminal, G, of the NMOS transistor 222-1, 222-2, 222-3, or 222-4, and the second voltage rail 220-2 is connected to the source terminal, S, of the NMOS transistor 222-1, 222-2, 222-3, or 222-4.

In these embodiments, the ballast resistors 210-3, 210-4 are electrically connected to the third voltage rail 220-3 having a voltage, $V_{DD\_int}$, which is lower than the voltage, $V_{DD}$, of the first voltage rail 220-1 and is higher than the voltage, $V_{SS}$, of the second voltage rail 220-2. By connecting the ballast resistors 210-3, 210-4 to the third voltage rail (i.e., connecting the midpoints between the clamp circuits 212-3, 212-4 and the corresponding ballast resistors 210-3, 210-4 together to a common midpoint and tapping the internal supply from this common midpoint), a low-ohmic internal supply is provided. In addition, by connecting the ballast resistors 210-3, 210-4 to the third voltage rail, an asymmetric clamp array in which some of the clamp branches have a larger value ballast resistor and a smaller clamp, and some other clamp branches has a smaller value ballast resistor and a larger clamp, is created to more evenly spread ESD current during an ESD event. The third voltage rail 220-3 having the voltage, $V_{DD\_int}$, supplies some internal circuit blocks of the ESD cell 206, such as the driver circuit 214. The first node 208-1 that connects directly to the voltage, $V_{DD}$, to cannot be used as the supply node to the internal circuit blocks, as the voltage, $V_{DD}$, during a system level ESD event can rise to a levels that may cause damages to the internal circuit blocks. The voltage at the midpoint node between a clamp circuit and its corresponding ballast resistor, however, remains at a safe level during an ESD event. From ESD design perspective, the midpoint node between a clamp circuit and its corresponding ballast resistor is a possible supply node for the internal circuits. However, because the midpoint node between a clamp circuit and its corresponding ballast resistor is connected to the first voltage rail via a ballast resistance and the voltage, $V_{DD}$, at the first voltage rail is held at a fixed voltage by an external supply during the normal operation of the ESD cell, the voltage at the midpoint may vary as more or less current is drawn by the circuit. However, in many ICs, it may not be acceptable if the supply voltage drops sharply when more current is drawn. In the embodiment depicted in FIG. 2, the midpoints between the clamp circuits 212-3, 212-4 and the corresponding ballast resistors 210-3, 210-4 are connected together to a common midpoint. Consequently, the effective resistance between the first voltage rail and the third voltage rail in FIG. 2 is lower than (e.g., being half of) the effective resistance between the first voltage rail and the third voltage rail if only a single midpoint is used. In another example, when the midpoints between twelve clamp circuits and the corresponding twelve ballast resistors are connected together to a common midpoint, the effective resistance between the first voltage rail and the third voltage rail is $\frac{1}{12}$ of the effective resistance between the first voltage rail and the third voltage rail if only a single midpoint is used.

The driver circuit 214 of the ESD cell 206 is connected between the second and third voltage rails 220-2, 220-3 and configured to generate a driver signal (e.g., a driver voltage and/or a driver current), for example, the voltage, $V_{DD\_int}$, of the third voltage rail 220-3. In the embodiment depicted in FIG. 2, the driver circuit includes a gate driver 226 and a gate driver protection circuit 228, which includes two diodes 230, 232 that are connected between the second and third voltage rails 220-2, 220-3, two ballast resistors 234, 236, and two transistor devices 238, 240 that are implemented as a P-channel MOSFET (PMOS) transistor and an NMOS transistor such as a grounded gate NMOS transistor to (GGNmost). In some embodiments, instead of ballast resistor type, at least one of the two resistors 234, 236 is implemented as a resistor of other type. In the gate driver protection circuit 228, the first voltage rail 220-1 is connected to the source terminal, S, of the PMOS transistor 238 and to the gate terminal, G, of the PMOS transistor 238, and the ballast resistor 234 is connected to the drain terminal, D, of the PMOS transistor 238. The second voltage rail 220-2 is connected to the source terminal, S, of the GGNmost 240 and to the gate terminal, G, of the GGNmost 240, and the ballast resistor 236 is connected to the drain terminal, D, of the GGNmost 240. The driver circuit 214 can sustain high voltage on the I/O pads, I/O_20, during a system level ESD pulse without suffering damage. The gate driver protection circuit protects the gate driver and the gates of transistor devices of the output stage 216. In the embodiment depicted in FIG. 2, the gate driver is supplied from the third voltage rail, and the output stage is supplied from the first voltage rail. The ballast resistors 234, 236 of the gate driver protection circuit are connected between an output terminal of the gate driver and gate terminals of transistor devices of the output stage. The PMOS transistor 238, the GGNmost 240, and the diodes 230, 232 provide an internal path for a small part of the current that flows during a system level ESD event. This current builds a voltage drop across the ballast resistors 234, 236 and keeps the gate-source voltage difference of transistors devices of the output stage to be within a safe limit. When a large resistance value for the ballast resistors 234, 236 is chosen, the gate driver protection circuit can be implemented with a minimum of additional silicon footprint because the internal current is small. However, the large resistance value may have impact on circuit performance. On the other hand, a small value for the series resistance can minimize the impact on circuit performance, but allow a larger internal current during an ESD event, for which larger devices are needed to carry that current in an ESD safe fashion.

The output stage 216 of the ESD cell 206 is connected between the first and second voltage rails 220-1, 220-2 and configured to generate an output signal (e.g., output current and/or voltage to be applied to the core circuit 102) in response to the driver signal from the driver circuit 214. In the embodiment depicted in FIG. 2, the output stage includes a transistor device 242 that is implemented as a PMOS transistor, two ballast resistors 244, 246, a transistor device 248 that is implemented as an NMOS transistor, and two diodes 250, 252 that are connected between the first and second voltage rails 220-1, 220-2. In some embodiments, instead of ballast resistor type, at least one of the two resistors 244, 246 is implemented as a resistor of other type. In the output stage 216, the first voltage rail 220-1 is connected to the source terminal, S, of the PMOS transistor 242, the PMOS transistor 238 of the gate driver protection circuit 228 is connected to the gate terminal, G, of the PMOS transistor 242, and the ballast resistor 244 is connected to the drain terminal, D, of the PMOS transistor 242. The second voltage rail 220-2 is connected to the source terminal, S, of the NMOS transistor 248, the ballast resistor 236 of the gate driver protection circuit 228 is connected to the gate terminal, G, of the NMOS transistor 248, and the ballast resistor 246 is connected to the drain terminal, D, of the NMOS transistor 248. The output stage 216 can make the output robust against higher transient voltage to reduce the degradations in a corresponding core circuit caused by overvoltage.

In an example operation of the ESD cell 206, an ESD event (e.g., a positive IEC-61000-4-2 strike on any of related pins or terminal) causes a high voltage (e.g., a voltage with a magnitude in the order of around 20 Volts(V)) on the first node 208-1. At the same time, the sharp onset of the voltage, $V_{DD}$, at the first node 208-1 (e.g., the voltage, $V_{DD}$, at the first node 208-1 ramping up from 0 V to 20 V in about one nanosecond at the start of an ESD pulse) activates the clamp circuits 212-1, 212-2, 212-3, 212-4. For example, the clamp circuits 212-1, 212-2, 212-3, 212-4 sense the voltage increase on the first node 208-1 through the corresponding ballast resistors 210-1, 210-2, 210-3, 210-4 through which the clamp circuits 212-1, 212-2, 212-3, 212-4 are connected to the first node 208-1. When the clamp circuits 212-1, 212-2, 212-3, 212-4 are activates, the clamp circuits 212-1, 212-2, 212-3, 212-4 maintain a voltage, $V_{DD\_int}$, of around 5 V (or somewhat less) at the third voltage rail, 220-3. The voltage difference between the voltage, $V_{DD}$, of 20 V at the first voltage rail 220-1, and the voltage, $V_{DD\_int}$, of 5 V at the third voltage rail 220-3, is bridged by a 15 V voltage difference across the ballast resistors. An ESD current (e.g., a total of 30 A or so of an ESD current) is flowing through the clamp branches formed by the ballast resistors 210-1, 210-2, 210-3, 210-4 and the clamp circuits 212-1, 212-2, 212-3, 212-4 from the first node 208-1 to the second node 208-2. At the same time, the gate driver 226 senses a voltage difference (e.g., a voltage difference of 20 V between the first node 208-1 and the second node 208-2), and needs to be protected from the voltage difference by the gate driver protection circuit 228. In the gate driver protection circuit 228, each of the PMOS transistor 238 and the GGNmost 240 act as a local snapback clamp. The local snapback clamp is designed to not conduct while the local snapback clamp has a voltage across the local snapback clamp that is less than a voltage threshold (e.g., 5 or 6 V). When the local snapback clamp has a voltage across the local snapback clamp that exceeds the voltage threshold, the local snapback clamp conducts current. A diode pair, which is formed by the diode 230 connected between the third voltage rail 230-3 and the output of the gate driver 226 and the diode 232 connected between the second voltage rail and the output of the gate driver 226, can limit the voltage on the gate driver output to −1 V with respect to the voltage, $V_{SS}$, at the second voltage rail 220-2 and to +1 V with respect to the voltage, $V_{DD\_int}$, at the third voltage rail 220-3. During a positive ESD strike (e.g., an ESD strike on the first node 208-1 or on any of the IO-pads that connect to the first node 208-1, the gate driver protection circuit 228 ensures that the output of the gate driver remains at 6 V with respect to the voltage, $V_{SS}$, or less. At the same time, the gate driver protection circuit 228 ensures that voltage at the gate terminal of the PMOS transistor 242 of the output stage 216 is not higher than 6 V below the potential of $V_{DD}$, which is a safe limit for the PMOS transistor 242. Specifically, until the voltage, $V_{DD}$, at the first voltage rail reaches about 12 V, no current flows in the connection between the gate driver and the PMOS transistor 242 of the output stage. At this time, however, the clamp circuits 212-3, 212-4 connected to the third voltage rail are activated to maintain the voltage, $V_{DD\_int}$, at the third voltage rail at 5 V or less. As a result, the output voltage of the gate driver does not exceed 6 V. When the output voltage of the gate driver exceeds 6 V, the diode 230 between the gate driver output and the third voltage rail starts passing current, which have the effect of clamping the voltage on the gate driver output to 6 V or less. At the same time, the PMOS transistor 238 acts as a local snapback clamp, which limits the voltage difference between the gate terminal of the PMOS transistor 242 and the voltage, $V_{DD}$, at the first voltage rail to be less than 6 V also. Because there is no current, there is also no voltage drop across the resistor 234. The voltage difference is divided between the local snapback clamp (i.e., the PMOS transistor 238), the diode 230, and the clamp circuits 212-3, 212-4 connected to the third voltage rail. When the voltage difference between the voltage, $V_{DD}$, at the first voltage rail and the voltage, VSS, at the second voltage rail exceeds 12 V, the local snapback clamp (i.e., the PMOS transistor 238) (i.e., the PMOS transistor 238) has a voltage of about 6 V and starts to pass current. This current flow is typically small (e.g., order of magnitude in a few tens of milliamps), compared to the amount of current that passes in the main clamp array. At the same time, the diode 230 and the clamp circuits 212-3, 212-4 connected to the third voltage rail continue to limit the voltage on the gate driver output to 6 V, while passing current. Because there is a current, the resistor 234 takes up the remaining voltage drop, and the voltage is divided between the local snapback clamp (i.e., the PMOS transistor 238), the resistor 234, the diode 230, and the clamp circuits 212-3, 212-4. The other local snapback clamp (i.e., the GGNmost 240) and the ballast resistor 236 protect the NMOS transistor 248 of the output stage during a negative ESD event.

Figure 3:
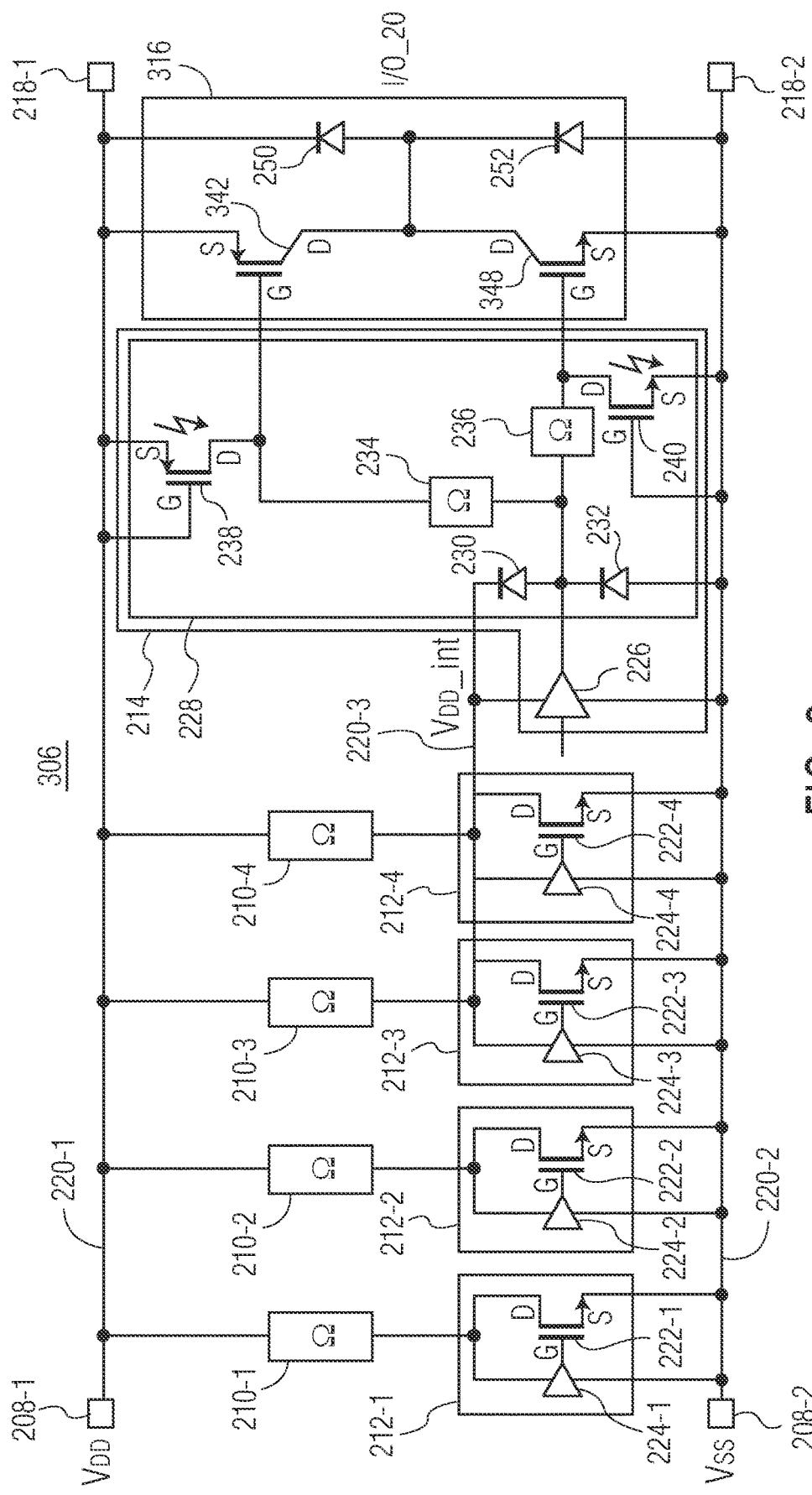
FIG. 3 depicts an ESD cell having an output stage composed of extended drain MOS transistors that can be used in an ESD protection device of the electrical device depicted in FIG. 1.

In some embodiments, an output stage is composed of extended drain MOS transistors, instead of low voltage MOS transistors (e.g., the PMOS transistor 242 and the NMOS transistor 248) with or without silicide block and series resistance (e.g., the ballast resistors 244, 246). Using MOS transistors with or without silicide block and series resistors may have a cost advantage since it takes less silicon area and allows fabrication in a cheaper diffusion process. On the other hand, a design that exploits the parasitic bipolar mode of an NMOS transistor (e.g., an NMOS transistor with silicide block) can be complicated. Compared to low voltage MOS transistors, extended drain MOS transistors may be easier to design. However, extended drain MOS transistors may be more expensive as extended drain MOS transistors require more silicon area, and can only be used in a diffusion process variant that offers extended drain devices. FIG. 3 depicts an ESD cell 306 having an output stage 316 composed of extended drain MOS transistors that can be used in the ESD protection device 104 depicted in FIG. 1. In the embodiment depicted in FIG. 3, the ESD cell 306 is electrically connected to the I/O pad, I/O_20, having the two nodes or terminals 218-1, 218-2 and includes the four clamp circuits 212-1, 212-2, 212-3, 212-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and a third voltage rail 220-3, and the output stage 316, which includes an extended drain PMOS transistor 342, an extended drain NMOS transistor 348, and the diodes 250, 252. In the output stage 316, the first voltage rail 220-1 is connected to the source terminal, S, of the extended drain PMOS transistor 342, the PMOS transistor 238 of the gate driver protection circuit 228 is connected to the gate terminal, G, of the extended drain PMOS transistor 342, and the drain terminal, D, of the extended drain NMOS transistor 348 is connected to the drain terminal, D, of the extended drain PMOS transistor 342. The second voltage rail 220-2 is connected to the source terminal, S, of the extended drain NMOS transistor 348, and the ballast resistor 236 of the gate driver protection circuit 228 is connected to the gate terminal, G, of the extended drain NMOS transistor 348. The ESD cell 306 depicted in FIG. 3 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 3 and can be implemented differently from the ESD cell 306 depicted in FIG. 3.

In some embodiments, the output stage 216 is composed of extended drain MOS transistors, instead of low voltage MOS transistors (e.g., the PMOS transistor 242 and the NMOS transistor 248) with or without silicide block and series resistance (e.g., the resistors 244, 246). Using MOS transistors with or without silicide block and series resistors may have a cost advantage since it takes less silicon area and allows fabrication in a cheaper diffusion process. On the other hand, a design that exploits the parasitic bipolar mode of an NMOS transistor (e.g., an NMOS transistor with silicide block) can be complicated. Compared to low voltage MOS transistors, extended drain MOS transistors may be easier to design. However, extended drain MOS transistors may be more expensive as extended drain MOS transistors require more silicon area, and can only be used in a diffusion process variant that offers extended drain devices. FIG. 3 depicts an ESD cell 306 having an output stage 316 composed of extended drain MOS transistors that can be used in the ESD protection device 104 depicted in FIG. 1. In the embodiment depicted in FIG. 3, the ESD cell 306 is electrically connected to the I/O pad, I/O_20, having the two nodes or terminals 218-1, 218-2 and includes the four clamp circuits 212-1, 212-2, 212-3, 212-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and a third voltage rail 220-3, and the output stage 316, which includes an extended drain PMOS transistor 342, an extended drain NMOS transistor 348, and the diodes 250, 252. In the output stage 316, the first voltage rail 220-1 is connected to the source terminal, S, of the extended drain PMOS transistor 342, the PMOS transistor 238 of the gate driver protection circuit 228 is connected to the gate terminal, G, of the extended drain PMOS transistor 342, and the drain terminal, D, of the extended drain NMOS transistor 348 is connected to the drain terminal, D, of the extended drain PMOS transistor 342. The second voltage rail 220-2 is connected to the source terminal, S, of the extended drain NMOS transistor 348, and the ballast resistor 236 of the gate driver protection circuit 228 is connected to the gate terminal, G, of the extended drain NMOS transistor 348. The ESD cell 306 depicted in FIG. 3 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 3 and can be implemented differently from the ESD cell 306 depicted in FIG. 3.

Figure 4:
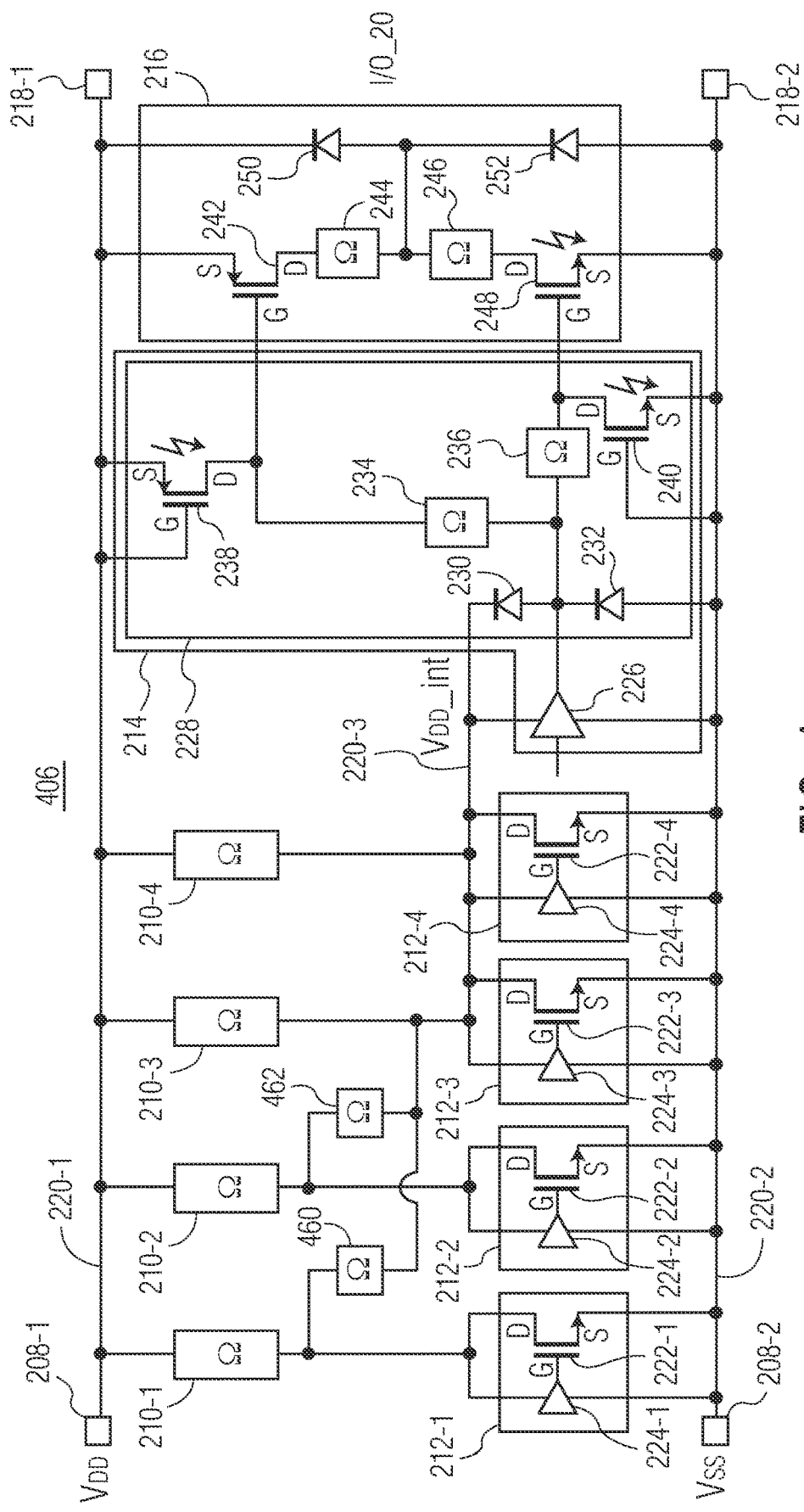
FIG. 4 depicts an ESD cell having additional resistors that connect midpoints of additional clamp branches to a third voltage rail that can be used in an ESD protection device of the electrical device depicted in FIG. 1.

In the ESD cell 206, 306 depicted in FIGS. 2 and 3, the third voltage rail 220-3 having the voltage, $V_{DD\_int}$, is fed directly from the midpoints of two parallel clamp branches (i.e., the clamp branch including the clamp circuit 212-3 and the ballast resistor 210-3 and the clamp branch including the clamp circuit 212-4 and the ballast resistor 210-4) in each ESD cell. Choosing the number of midpoints from which to feed the third voltage rail is a careful balance. For example, when too few midpoints are chosen, there may be an unacceptably high resistance on the third voltage rail which supplies inner circuits. When too many midpoints are chosen, large cross-currents may flow across the third voltage rail during a system level ESD event, which might compromise the balanced current flow. In some cases, lumping several midpoints of clamp branches together may not able to provide a sufficient low-ohmic supply. In some embodiments, the resistance between the first voltage rail 220-1 and the third voltage rail can be lowered further by connecting midpoints of additional clamp branches to the third voltage rail via resistors. FIG. 4 depicts an ESD cell 406 having additional ballast resistors 460, 462 that connect midpoints of additional clamp branches to a third voltage rail that can be used in the ESD protection device 104 depicted in FIG. 1. In the embodiment depicted in FIG. 4, the ESD cell 406 is electrically connected to the I/O pad, I/O_20, having the two nodes or terminals 218-1, 218-2 and includes the four clamp circuits 212-1, 212-2, 212-3, 212-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and the third voltage rail 220-3, the output stage 216, and the two ballast resistors 460, 462 that connect additional midpoints of the clamp branch of the clamp circuit 212-1 and the corresponding ballast resistor 210-1 and the clamp branch of the clamp circuit 212-2 and the corresponding ballast resistor 210-2 to the third voltage rail. In the ESD cell 406, the midpoint between the ballast resistor 210-1 and the clamp circuit 212-1 is connected to the third voltage rail via the ballast resistor 460, while the midpoint between the ballast resistor 210-2 and the clamp circuit 212-2 is connected to the third voltage rail via the ballast resistor 462. Compared to the ESD cell 206 depicted in FIG. 2, in the ESD cell 406 depicted in FIG. 4, the resistance between the first voltage rail 220-1 and the third voltage rail can be lowered further by connecting midpoints of additional clamp branches to the third voltage rail via resistors 460, 462. The ESD cell 406 depicted in FIG. 4 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 4 and can be implemented differently from the ESD cell 406 depicted in FIG. 4.

Figure 5:
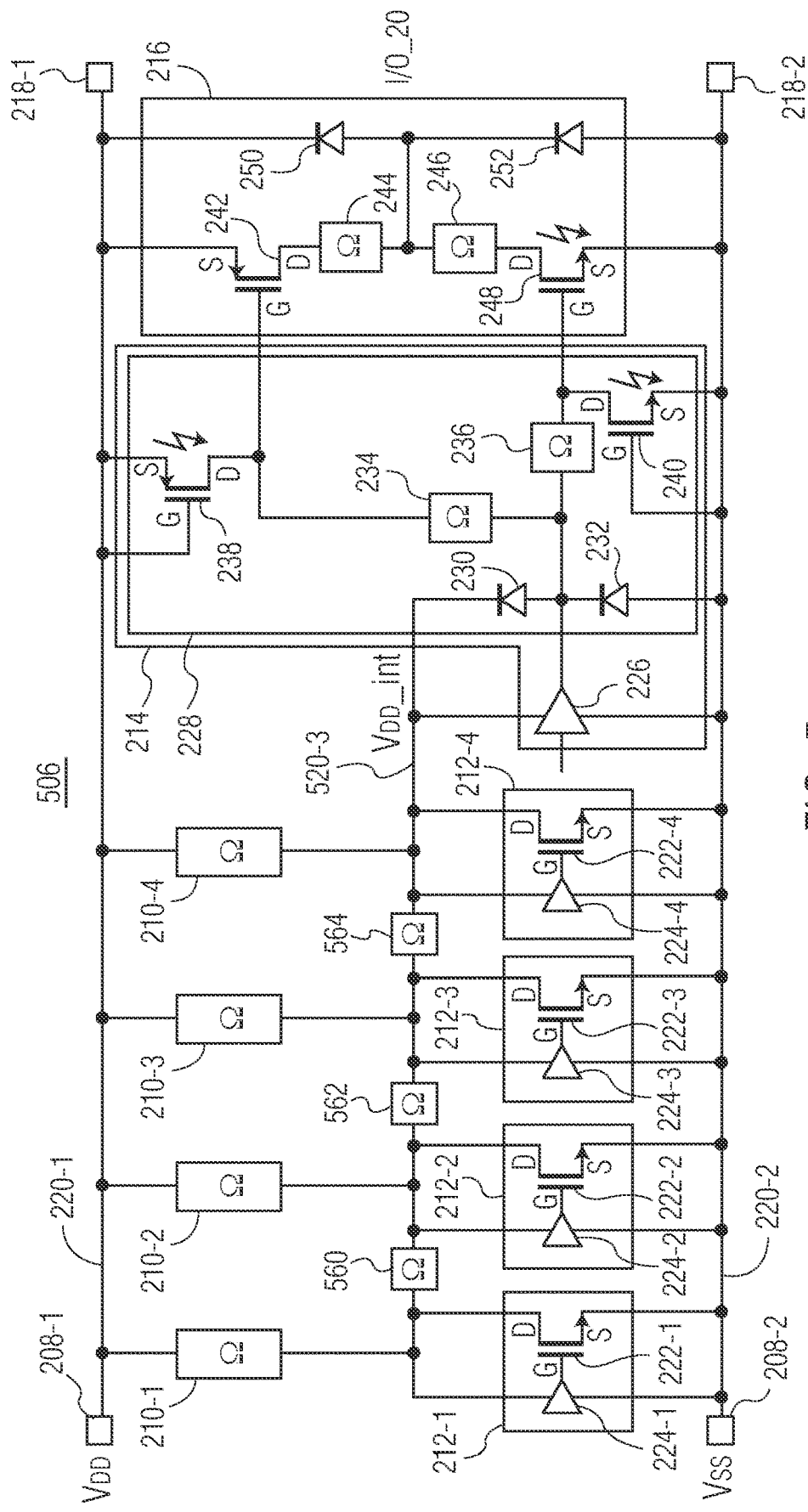
FIG. 5 depicts an ESD cell having resistors included in a third voltage rail that can be used in an ESD protection device of the electrical device depicted in FIG. 1.

In some embodiments, resistors are included in a third voltage rail (e.g., the third voltage rail 220-3 depicted in FIG. 2) to suppress excessive cross currents during a system level ESD event. FIG. 5 depicts an ESD cell 506 having resistors 560, 562, 564 included in a third voltage rail 520-3 that can be used in the ESD protection device 104 depicted in FIG. 1. In the embodiment depicted in FIG. 5, the ESD cell 506 is electrically connected to the I/O pad, I/O_20, having the two nodes or terminals 218-1, 218-2 and includes the four clamp circuits 212-1, 212-2, 212-3, 212-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and the third voltage rail 520-3, the output stage 216, and three resistors 560, 562, 564 that are included in the third voltage rail 520-3. In the ESD cell 506, the four clamp circuits 212-1, 212-2, 212-3, 212-4 and the four ballast resistors 210-1, 210-2, 210-3, 210-4 are connected to the third voltage rail 520-3. Compared to the ESD cell 206 depicted in FIG. 2, in the ESD cell 406 depicted in FIG. 4, the resistors 560, 562, 564 in the third voltage rail 520-3 can suppress excessive cross currents during a system level ESD event. The ESD cell 506 depicted in FIG. 5 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 5 and can be implemented differently from the ESD cell 506 depicted in FIG. 5.

Figure 6:
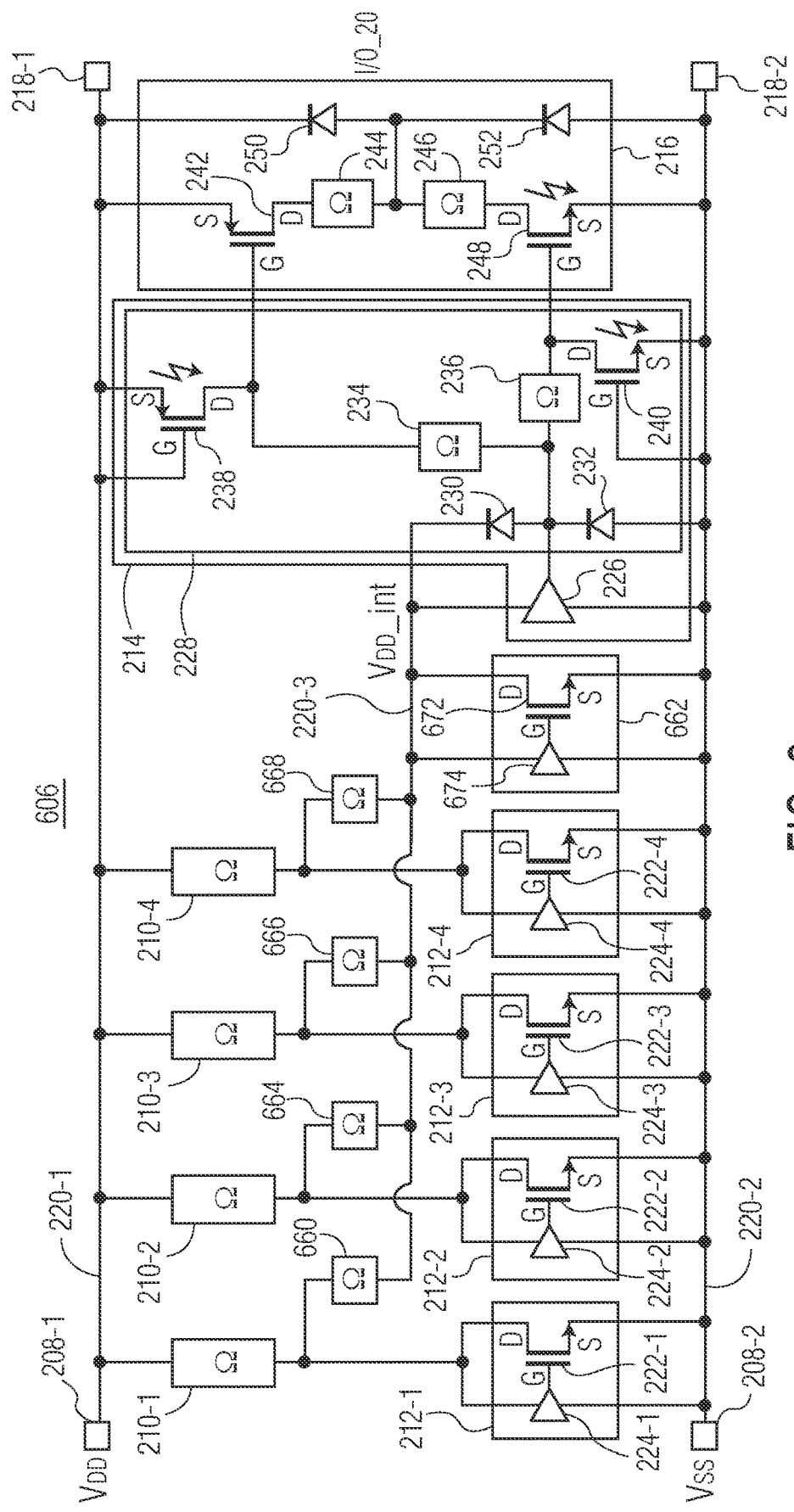
FIG. 6 depicts an ESD cell having a dedicated clamp circuit to protect a third voltage rail that can be used in an ESD protection device of the electrical device depicted in FIG. 1.

In some embodiments, a dedicated clamp circuit is placed between the third voltage rail 220-3 and the second voltage rail 220-2 to further protect internal circuit blocks fed from the third voltage rail 220-3 and in particular, protects the output of the gate driver 226. FIG. 6 depicts an ESD cell 606 having a dedicated clamp circuit 662 to protect the third voltage rail 220-3 that can be used in the ESD protection device 104 depicted in FIG. 1. In the embodiment depicted in FIG. 6, the ESD cell 606 is electrically connected to the I/O pad, I/O_20, having the two nodes or terminals 218-1, 218-2 and includes the four clamp circuits 212-1, 212-2, 212-3, 212-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and the third voltage rail 220-3, the output stage 216, four resistors 660, 664, 666, 668 that connect midpoints of clamp branches to the third voltage rail, and the dedicated clamp circuit 662, which includes an NMOS transistor 672 and a trigger circuit 674 configured to trigger or control the NMOS transistor 672. Within the clamp circuit 662, the third voltage rail is connected to the drain terminal, D, of the NMOS transistor 672, the trigger circuit 674 is connected to the gate terminal, G, of the NMOS transistor 672, and the second voltage rail 220-2 is connected to the source terminal, S, of the NMOS transistor 672. In the ESD cell 506, the four clamp circuits 212-1, 212-2, 212-3, 212-4 and the four ballast resistors 210-1, 210-2, 210-3, 210-4 are connected to the third voltage rail via a corresponding resistor 660, 664, 666, or 668. The ESD cell 606 depicted in FIG. 6 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 6 and can be implemented differently from the ESD cell 606 depicted in FIG. 6.

Figure 7:
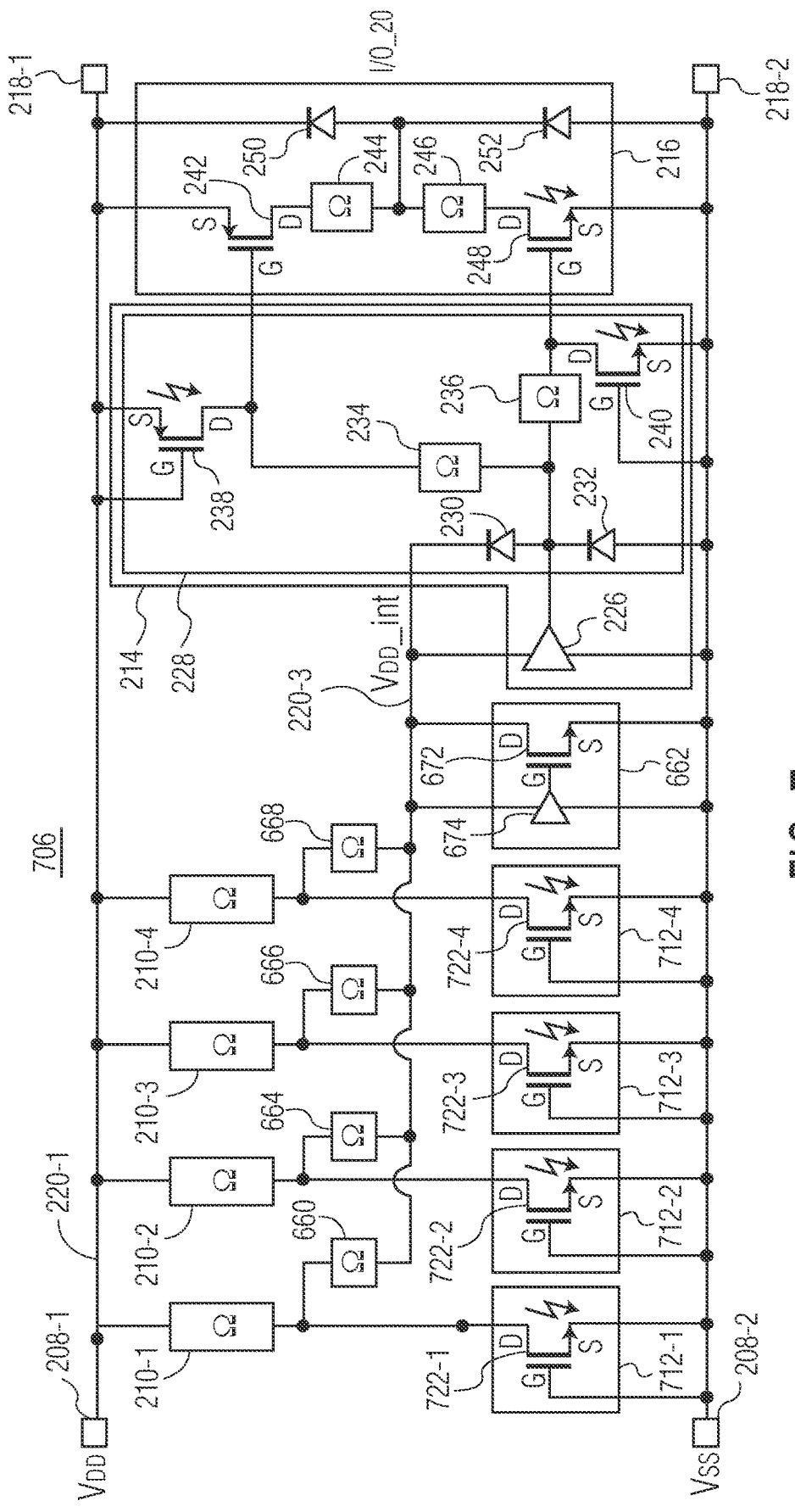
FIG. 7 depicts an ESD cell having clamp circuits implemented as grounded gate NMOS transistors (GGNmosts) that can be used in an ESD protection device of the electrical device depicted in FIG. 1.

The clamp circuits 212-1, 212-2, 212-3, 212-4 in the ESD cells 206, 306, 406, 506, 606 depicted in FIGS. 2-6 can be implemented as capacitively triggered railclamps, consisting of a large N-channel MOSFET that is driven by a trigger circuit that activates on the rapid rise in supply voltage that typically happens during the initial phase of an ESD pulse (e.g., a system level ESD pulse). However, clamp circuits that can be used in the ESD cells 106-1, 106-2, 106-3, 106-4, 106-5, 106-6 depicted in FIG. 1 may be implemented using other types of clamp circuits, such as GGNmosts and/or silicon controlled rectifiers (SCRs). One advantage is that other types of clamp circuits can take more ESD current per unit area of silicon footprint compared to a railclamp, and consequently, save silicon area. In addition, during an ESD event, most ESD-clamps have an operating voltage that is higher than that of a railclamp, and a dedicated railclamp could be used to protect the third voltage rail 220-3. FIG. 7 depicts an ESD cell 706 having clamp circuits 712-1, 712-2, 712-3, 712-4 implemented as GGNmosts 722-1, 722-2, 722-3, 722-4 that can be used in the ESD protection device 104 depicted in FIG. 1. In the embodiment depicted in FIG. 7, the ESD cell 706 is electrically connected to the I/O pad, I/O_20, having the two nodes or terminals 218-1, 218-2 and includes the four clamp circuits 712-1, 712-2, 712-3, 712-4 electrically connected to the second voltage rail 220-2, the four ballast resistors 210-1, 210-2, 210-3, 210-4 connected between the first voltage rail 220-1 and the clamp circuits, the driver circuit 214 connected between the second rail 220-2 and the third voltage rail 220-3, the output stage 216, the four resistors 660, 664, 666, 668 that connect midpoints of clamp branches to the third voltage rail, and the dedicated clamp circuit 662, which includes the NMOS transistor 672 and the trigger circuit 674 configured to trigger or control the NMOS transistor 672. In the embodiment depicted in FIG. 7, each of the four clamp circuits 712-1, 712-2, 712-3, 712-4 is implemented as a GGNmost 722-1, 722-2, 722-3, 722-4. Within each clamp circuit, the third voltage rail is connected to the drain terminal, D, of the GGNmost 722-1, 722-2, 722-3, or 722-4 via a corresponding resistor 660, 664, 666, or 668, and the second voltage rail 220-2 is connected to the gate terminal, G, and the source terminal, S, of the GGNmost 722-1, 722-2, 722-3, or 722-4. The ESD cell 706 depicted in FIG. 7 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 7 and can be implemented differently from the ESD cell 706 depicted in FIG. 7.

Figures 8, 9:
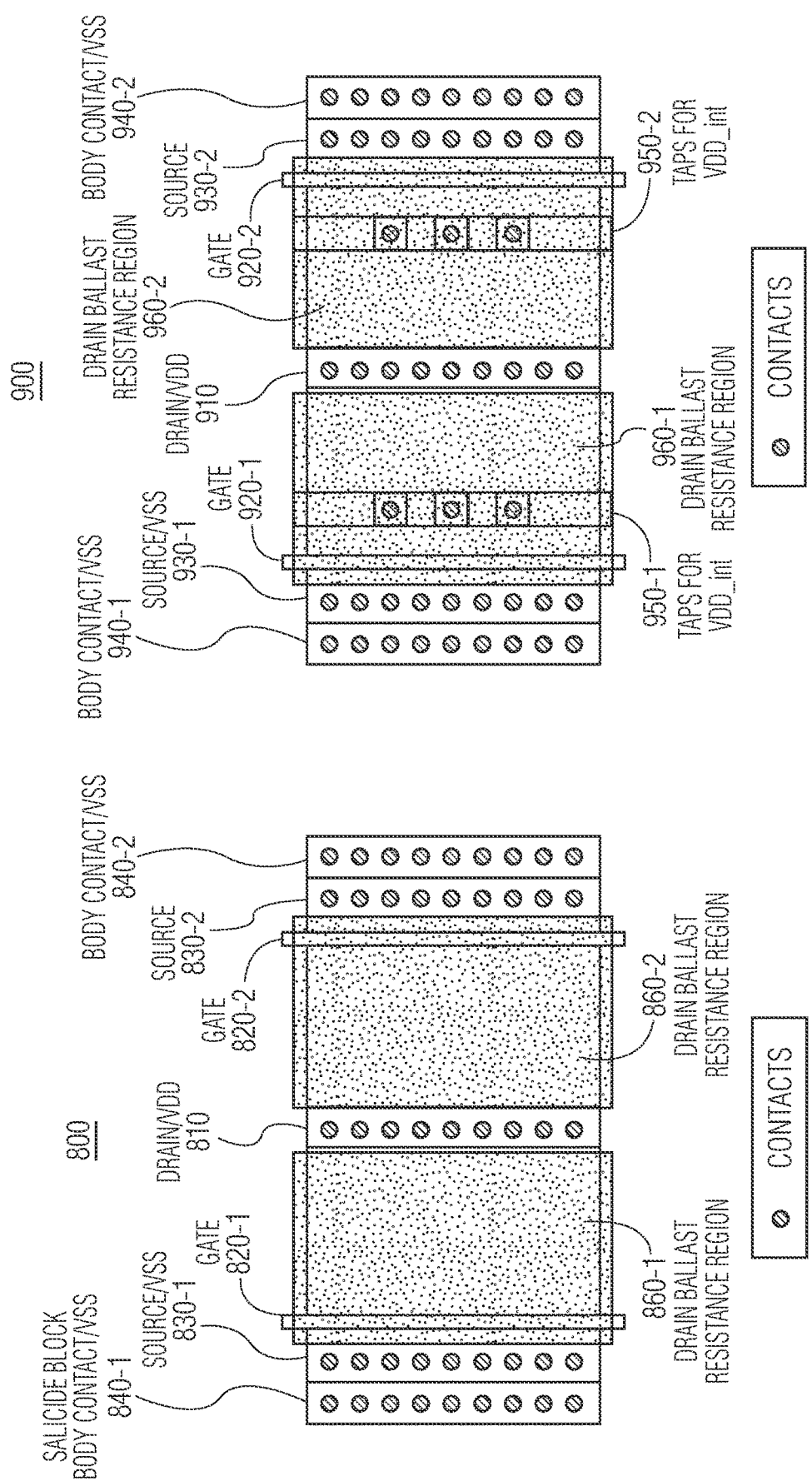
FIG. 8 depicts a circuit layout for a multi-finger GGNmost.
FIG. 9 depicts a circuit layout for another multi-finger GGNmost in which contacts are added in a drain region.

In some embodiments, a multi-finger GGNmost in which each finger has increased internal ballast resistance to enforce multi-finger triggering is used in the ESD cells 106-1, 106-2, 106-3, 106-4, 106-5, 106-6 depicted in FIG. 1. In these embodiments, a multi-finger GGNmost in essence constitutes a clamp circuit with an integrated ballast resistor. FIG. 8 depicts a circuit layout 800 for a multi-finger GGNmost. In the embodiment depicted in FIG. 8, the circuit layout includes a drain region 810 with contacts that may be connected to the voltage, $V_{DD}$, two drain ballast resistance regions 860-1, 860-2 each composed of n-active silicon and silicide block, two gate regions 820-1, 820-2 with contacts, two source regions 830-1, 830-2 with contacts that may be connected to the voltage, $V_{SS}$, and two body contact regions 840-1, 840-2 that may be connected to the voltage, $V_{SS}$. Depending on the processing technology, the multi-finger GGNmost may or may not have silicide blocks. In some embodiments, the distance between gate contacts or drain contacts is about 7 micrometer (μm) or more, the drain ballast resistance is sufficient to spread ESD current along one finger and force multi-finger triggering. FIG. 9 depicts a circuit layout 900 for another multi-finger GGNmost in which contacts are added in a drain region 910 to serve as pick-ups for an internal voltage node (e.g., a node with a voltage, $V_{DD\_int}$, and connected to the third voltage rail 220-3 or 520-3). In the embodiment depicted in FIG. 9, the circuit layout includes the drain region 910 with contacts that may be connected to the voltage, $V_{DD}$, two drain ballast resistance regions 960-1, 960-2 each composed of n-active silicon and silicide block, two gate regions 920-1, 920-2 with contacts that can be implemented using silicide blocks, two source regions 930-1, 930-2 with contacts that may be connected to the voltage, $V_{SS}$, and two body contact regions 940-1, 940-2 that may be connected to the voltage, $V_{SS}$. Two regions or areas 950-1, 950-2 with taps or contacts (e.g., taps for $V_{DD\_int}$) are formed on or in the drain ballast resistance regions 960-1, 960-2 for at least one internal voltage node. Depending on the processing technology, the contacts may or may not have a surrounding window in the silicide block layer.

Figure 10:
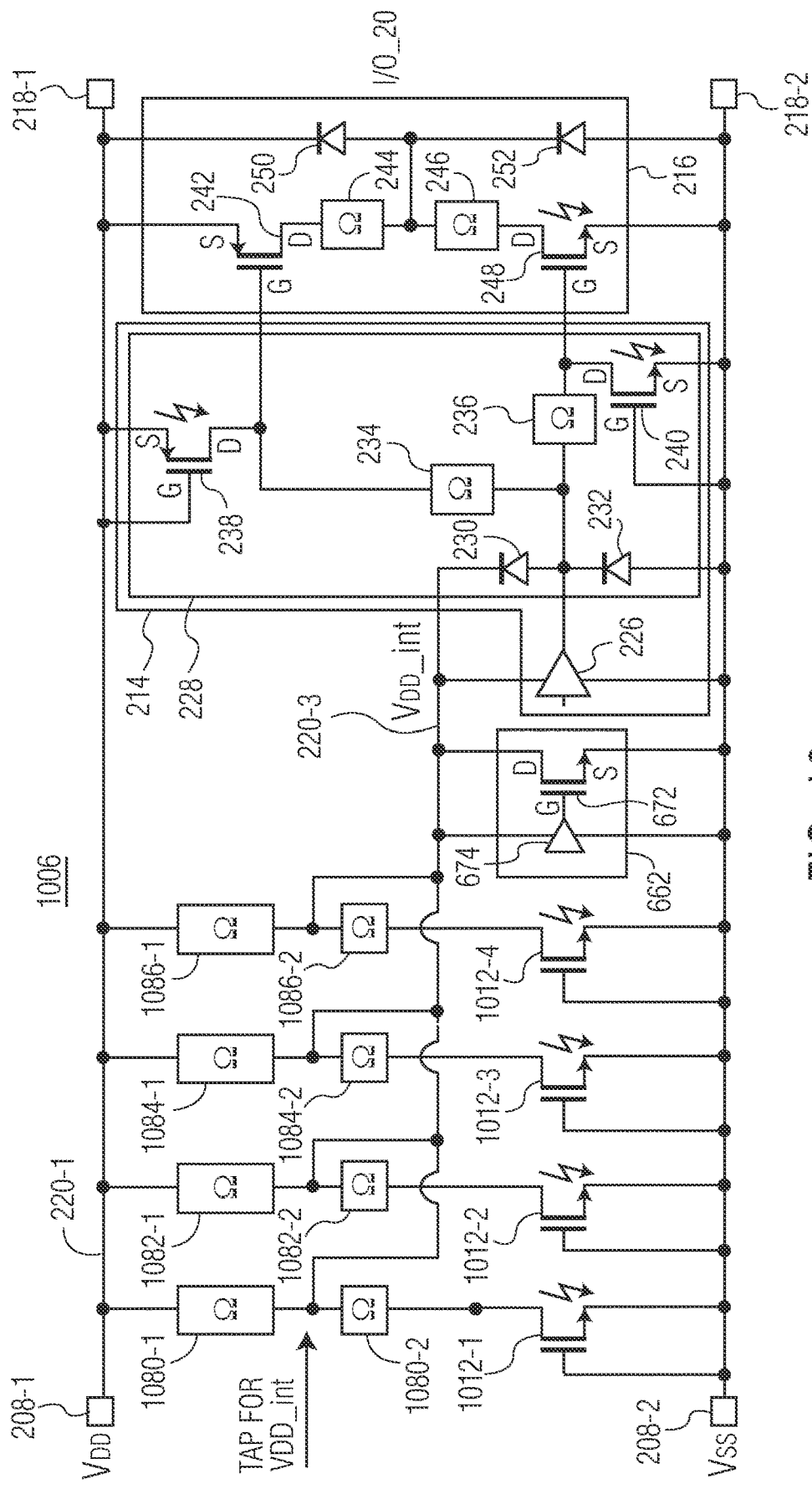
FIG. 10 depicts an ESD cell that can be used in an ESD protection device of the electrical device depicted in FIG. 1 that corresponds to the circuit layout depicted in FIG. 9.

FIG. 10 depicts an ESD cell 1006 that can be used in the ESD protection device 104 depicted in FIG. 1 that corresponds to the circuit layout 900 depicted in FIG. 9. The ESD cell 1006 may have the circuit layout 900 depicted in FIG. 9. In the embodiment depicted in FIG. 10, the ESD cell 1006 is electrically connected to the I/O pad, I/O_20, having the two nodes or terminals 218-1, 218-2 and includes the four clamp circuits that are implemented as GGNmosts 1012-1, 1012-2, 1012-3, 1012-4 with integrated resistors 1080-1, 1080-2, 1082-1, 1082-2, 1084-1, 1084-2, 1086-1, 1086-2 electrically connected to the first, second, and third voltage rails 220-1, 220-2, 220-3, a tap for the third voltage rail, the driver circuit 214 connected between the second rail 220-2 and the third voltage rail 220-3, the output stage 216, and the dedicated clamp circuit 662, which includes the NMOS transistor 672 and the trigger circuit 674 configured to trigger or control the NMOS transistor 672. The ESD cell 1006 depicted in FIG. 10 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 10 and can be implemented differently from the ESD cell 1006 depicted in FIG. 10.

Figure 11:
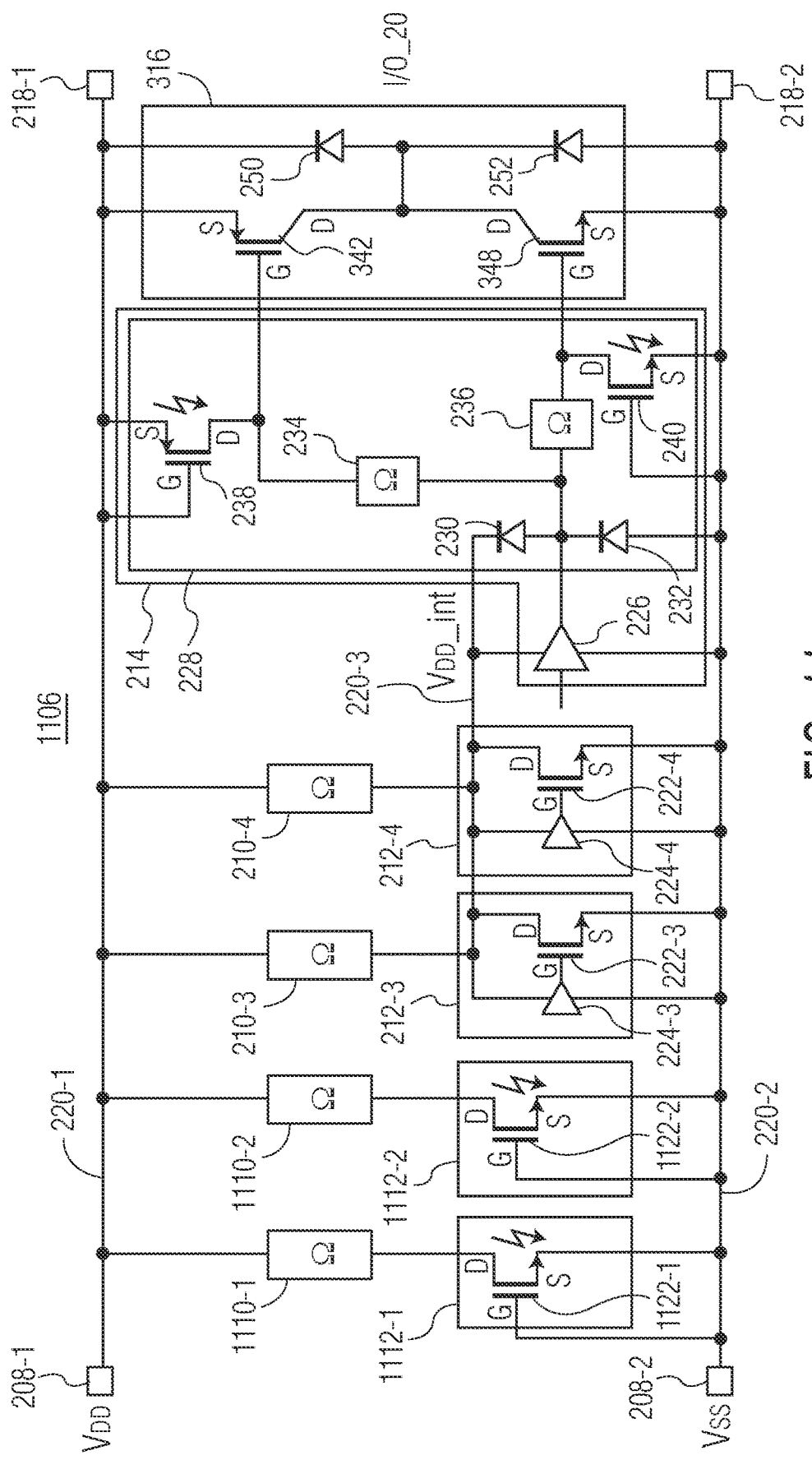
FIG. 11 depicts an ESD cell having a hybrid clamp array that can be used in an ESD protection device of the electrical device depicted in FIG. 1.

In some embodiments, different type of clamp circuits (i.e., a hybrid clamp array) is used within the ESD cell 106-1, 106-2, 106-3, 106-4, 106-5, or 106-6. For example, some clamp branches contain railclamps and of which the midpoints have been lumped together, while other clamp branches contain a different kind of clamp, such as GGNmosts. In some embodiments, the clamp branches containing railclamps and the clamp branches containing the other clamp-type have different values for their ballasting resistance to achieve an evenly balanced current across the hybrid clamp array. FIG. 11 depicts an ESD cell 1106 having a hybrid clamp array that can be used in the ESD protection device 104 depicted in FIG. 1. In the embodiment depicted in FIG. 11, the ESD cell 1106 is electrically connected to the I/O pad, I/O_20, having the two nodes or terminals 218-1, 218-2 and includes a hybrid clamp array having four clamp circuits 1112-1, 1112-2, 212-3, 212-4 electrically connected to the second voltage rail 220-2, four ballast resistors 1110-1, 1110-2, 210-3, 210-4 connected between the first voltage rail 220-1 and the clamp circuits, the driver circuit 214 connected between the second rail 220-2 and a third voltage rail 220-3, and the output stage 316, which includes the extended drain PMOS transistor 342, the extended drain NMOS transistor 348, and the diodes 250, 252. In the embodiment depicted in FIG. 11, each of the clamp circuits 1112-1, 1112-2 is implemented as a GGNmost 1122-1, 1122-2. Within each of the clamp circuits 1112-1, 1112-2, the ballast resistor 1110-1 is connected to the drain terminal, D, of the GGNmost 1122-1 or 1122-2, and the second voltage rail 220-2 is connected to the gate terminal, G, and the source terminal, S, of the GGNmost 1122-1 or 1122-2. In some embodiments, the resistance value of the ballast resistors 210-3, 210-4 is different from the resistance value of the ballast resistors 1110-1, 1110-2 to achieve an evenly balanced current across the hybrid clamp array. The ESD cell 1106 depicted in FIG. 11 is a possible implementation of the ESD cells 106-1, 106-2, 106-3, 106-4, 106-5, 106-6 depicted in FIG. 1. However, the ESD cells 106-1, 106-2, 106-3, 106-4, 106-5, 106-6 depicted in FIG. 1 are not limited to the embodiment depicted in FIG. 11 and can be implemented differently from the ESD cell 1106 depicted in FIG. 11.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device, the ESD protection device comprising:
   a first voltage rail electrically connected to a first node;
   a second voltage rail electrically connected to a second node; and
   a plurality of ESD cells connected between the first and second voltage rails and configured to shunt current in response to an ESD pulse received between the first and second nodes, wherein each of the ESD cells comprises:
   a plurality of clamp circuits electrically connected to the second voltage rail;
   a plurality of ballast resistors connected between the first voltage rail and the clamp circuits, wherein at least some of the ballast resistors are electrically connected to a third voltage rail;
   a driver circuit connected between the second and third voltage rails and configured to generate a driver signal; and
   an output stage configured to generate an output signal in response to the driver signal.

2. The ESD protection device of claim 1, wherein in each of the ESD cells, the driver circuit comprises:
   a gate driver connected between the second voltage rail and the third voltage rail; and
   a gate driver protection circuit configured to protect the gate driver.

3. The ESD protection device of claim 2, wherein the gate driver protection circuit comprises:
   a plurality of diodes electrically connected to an output of the gate driver;
   a plurality of resistors electrically connected to the diodes and to the output of the gate driver; and
   a plurality of transistor devices electrically connected to the first voltage rail or the second voltage rail.

4. The ESD protection device of claim 1, wherein the first voltage rail has a first voltage, wherein the second voltage rail has a second voltage, and wherein the second voltage is lower than the first voltage.

5. The ESD protection device of claim 4, wherein the third voltage rail has a third voltage, and wherein the third voltage is higher than the second voltage but is lower than the first voltage.

6. The ESD protection device of claim 4, wherein the second voltage is zero volt.

7. The ESD protection device of claim 1, wherein the clamp circuits in each of the ESD cells are of the same type.

8. The ESD protection device of claim 1, wherein the clamp circuits in each of the ESD cells are of different types.

9. The ESD protection device of claim 1, wherein the ballast resistors in each of the ESD cells are identical to each other.

10. The ESD protection device of claim 1, wherein each of the ballast resistors in one of the ESD cells have a unique resistance value.

11. The ESD protection device of claim 1, wherein in each of the ESD cells, the output stage comprises:
a plurality of diodes electrically between the first voltage rail and the second voltage rail;
a plurality of transistor devices electrically connected to the first voltage rail or the second voltage rail; and
a plurality of resistors electrically connected to the diodes and to the transistor devices.

12. The ESD protection device of claim 1, wherein at least one of the clamp circuits in one of the ESD cells comprises:
a transistor device electrically connected to the second voltage rail; and
a trigger circuit configured to trigger the transistor device.

13. The ESD protection device of claim 12, wherein the transistor device comprises an N-channel metal-oxide-semiconductor field-effect transistor (MOSFET) (NMOS) transistor.

14. The ESD protection device of claim 1, wherein at least one of the clamp circuits in one of the ESD cells comprises:
a transistor device having two terminals electrically connected to the second voltage rail.

15. The ESD protection device of claim 14, wherein the transistor device comprises a grounded gate NMOS transistor (GGNmost).

16. The ESD protection device of claim 1, wherein each of the ESD cells further comprises:
a clamp circuit connected between the third voltage rail and the second voltage rail.

17. The ESD protection device of claim 1, wherein each of the ESD cells further comprises:
at least one resistor connected between the ballast resistors and the third voltage rail.

18. The ESD protection device of claim 1, wherein the ESD protection device is an integrated circuit (IC) device.

19. An electrostatic discharge (ESD) protection device, the ESD protection device comprising:
a first voltage rail electrically connected to a first node;
a second voltage rail electrically connected to a second node; and
a plurality of ESD cells connected between the first and second voltage rails and configured to shunt current in response to an ESD pulse received between the first and second nodes, wherein each of the ESD cells comprises:
a plurality of clamp circuits electrically connected to the second voltage rail;
a plurality of ballast resistors connected between the first voltage rail and the clamp circuits, wherein at least some of the ballast resistors are electrically connected to a third voltage rail via another set of resistors;
a driver circuit connected between the second and third voltage rails and configured to generate a driver signal, wherein the driver circuit comprises a gate driver connected between the second voltage rail and the third voltage rail and a gate driver protection circuit configured to protect the gate driver; and
an output stage configured to generate an output signal in response to the driver signal.

20. An electrostatic discharge (ESD) protection device, the ESD protection device comprising:
a first voltage rail electrically connected to a first node;
a second voltage rail electrically connected to a second node; and
a plurality of ESD cells connected between the first and second voltage rails and configured to shunt current in response to an ESD pulse received between the first and second nodes, wherein each of the ESD cells comprises:
a plurality of grounded gate NMOS transistors (GGNmosts) electrically connected to the second voltage rail and a third voltage rail;
a driver circuit connected between the second and third voltage rails and configured to generate a driver signal; and
an output stage configured to generate an output signal in response to the driver signal.

* * * * *